United States Patent [19]

Grebe

[11] Patent Number: 5,373,627

[45] Date of Patent: Dec. 20, 1994

[54] METHOD OF FORMING MULTI-CHIP MODULE WITH HIGH DENSITY INTERCONNECTIONS

[76] Inventor: Kurt R. Grebe, 24 Van Nydeck Ave., Beacon, N.Y. 12508

[21] Appl. No.: 156,446

[22] Filed: Nov. 23, 1993

[51] Int. Cl.$^5$ .............................................. H05K 3/30
[52] U.S. Cl. ........................................ 29/841; 29/832; 174/52.2; 437/209
[58] Field of Search .............. 29/840, 841, 832, 827; 174/52.2; 437/209

[56] References Cited

U.S. PATENT DOCUMENTS

| | | | |
|---|---|---|---|
| 3,349,480 | 10/1967 | Rashleigh | 29/624 |
| 4,689,103 | 8/1987 | Elarde | 156/245 |
| 4,766,481 | 8/1988 | Gobrecht | 257/703 X |
| 4,783,695 | 11/1988 | Eichelberger et al. | 257/700 X |
| 4,857,671 | 8/1989 | Nakano et al. | 29/840 |
| 4,918,811 | 4/1990 | Eichelberger et al. | 29/840 |
| 5,048,179 | 9/1991 | Shindo et al. | 29/840 |
| 5,107,587 | 4/1992 | Thepault | 29/843 |
| 5,108,825 | 4/1992 | Wojnarowski et al. | |
| 5,151,776 | 9/1992 | Wojnarowski et al. | |
| 5,153,986 | 10/1992 | Brauer et al. | 29/846 |
| 5,206,463 | 4/1993 | DeMaso et al. | 174/254 |
| 5,207,865 | 5/1993 | Satoh | 156/643 |
| 5,216,806 | 6/1993 | Lam | 29/848 |
| 5,231,751 | 8/1993 | Sachdev et al. | 29/852 |
| 5,232,548 | 8/1993 | Ehrenberg et al. | 156/630 |
| 5,241,456 | 8/1993 | Marcinkiewicz et al. | 257/700 X |

OTHER PUBLICATIONS

Semiconductor International, p. 62, Jun. 1993.
M. S. Adler et al, paper TP11.2, presented at the International Solid State Circuits Conference, 1993, (session 11-Technology Directions).
H. Markstein, "Thin Film Overlay Combines With MCM-L", Electronic Packaging and Production, p. 13, Jun. 1993.

Primary Examiner—Carl J. Arbes

[57] ABSTRACT

A multi-chip module having very high density interconnect structures and a technique for making it, where all of the chips have their active device surfaces in a common plane. The chips are placed face down on an adjacent adhesive layer located on a substrate, which is preferably a flexible material. A conformal material is deposited over the backsides of the chips and in the spaces between the chips. A ground plane or metallic shield can then be formed over the conformal layer, if desired. The structure is then turned over and the glass layer on which the substrate is located is removed. Access vias are made through the substrate to the chip I/O's, and metallization provided to the chips. Interconnect metallization is then provided to complete the multi-chip module. In one embodiment, the substrate on which the chips are first supported is the first level of insulation above the active device surfaces of the chips and also ensures that the active device surfaces are in a common plane.

25 Claims, 3 Drawing Sheets

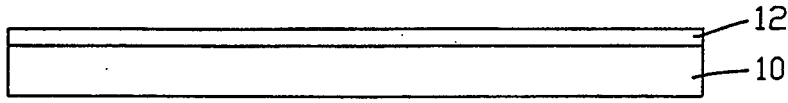
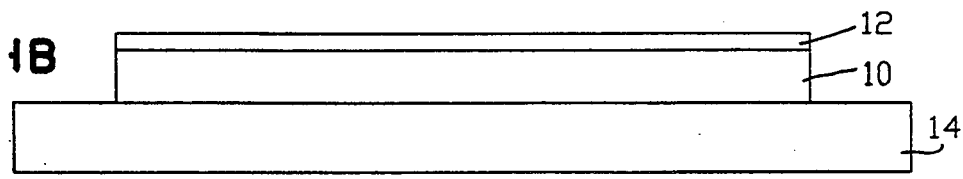
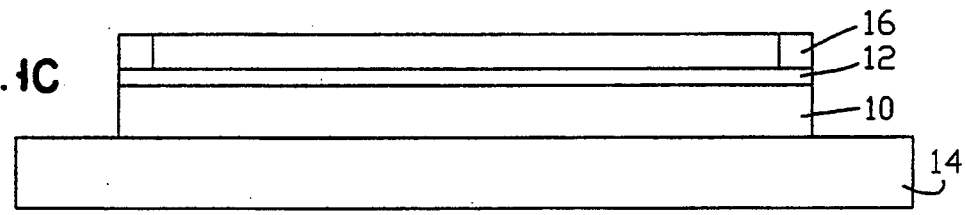
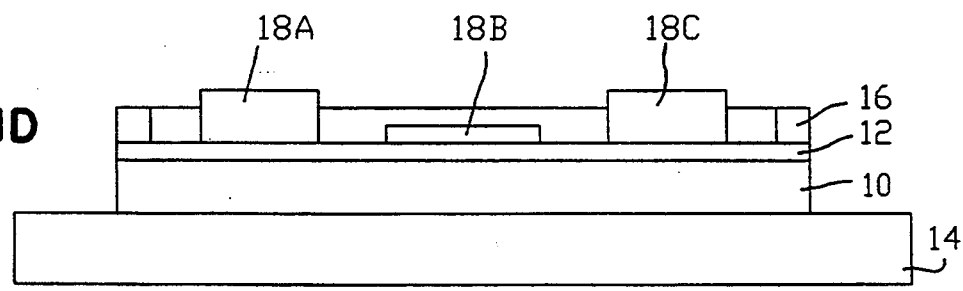
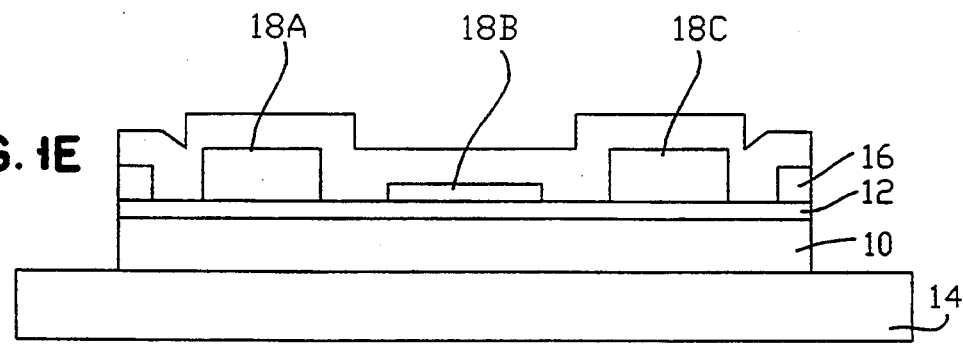

METHOD OF FORMING MULTI-CHIP MODULE WITH HIGH DENSITY INTERCONNECTIONS

DESCRIPTION

1. Field of the Invention

This invention relates to a structure and method for providing a multi-chip module that can be fabricated in a manner to allow high density interconnects between chips and in which efficient cooling is readily provided, and more particularly to a structure and method for easily obtaining a multi-chip module in which the active or device faces of the individual chips are easily and inexpensively located in a common plane.

2. Background of the Invention

Multi-chip modules (MCM) are well known in the art and provide many advantages, including that of allowing individual integrated circuit chips to be located very close to one another, thereby reducing chip-to-chip interconnection links, The module is a chip carrier on which the various chips are located and on which the chip terminals are fed out by various means to terminals spaced to suit the spacing and dimension of wires on the next higher level of package (i.e., card or board). The module will usually contain wiring planes and power planes interconnecting several of its chips. The multi-chip module is capable of supporting several chips on a single package, where the chip carrier can be a material such as a ceramic or silicon, or a laminate such as a common printed circuit board laminate material. Such materials include polyimide, glass epoxy or FR-4.

The power and signal planes on the substrate can be produced by thin-film or thick-film technology. For thin-film wiring, lithographic techniques are used, while in thick-film wiring the wiring pattern is formed by screening a conductive paste through a metal mask pattern onto the substrate.

The basis MCM technologies for bonding the chips to the substrate include wire bond connections, flip-chip connections, TAB connections and high density interconnect (HDI) direct metallurgical connections. In the wire bond connection, flexible wires are attached from bonding pads on the top of the chips to the substrate. In the flip-chip connection (C4 connection) very small soldier balls are formed during the sequence of process steps for the wafer. When the chip is placed on a substrate, the solder balls contact and melt onto an array of metal pads on the substrate. Surface tension of the liquid solder helps to align the chip properly on the substrate. In the TAB connection, a thin polymer tape containing metal circuitry has the circuitry connected to the chip via the inner lead bonds, while the other ends of the circuitry are connected to the substrate via outer lead bonds.

In the HDI direct metallurgical connection the chips are mounted directly on the PC board laminate substrate using standard board routing techniques for chip interconnection. Typically, cavities are made into the substrate into which the chips are placed, the cavities including an adhesive material for holding the chips in place. The HDI process is described in more detail in *Semiconductor International* p.62, June 1993 and in paper TP11.2 presented at the International Solid State Circuits Conference 1993. This paper was presented by M. S. Adler et al and was given at Session 11 (Technology Directions). These references generally describe the advantages of the HDI technology. In contrast with the wire bond connections, flip-chip connections and TAB connections for forming the MCM, HDI offers an advantage in that the chip interconnections are not located between the chips and the substrate. This means that the chip interconnection layers do not form a thermal barrier between the chips and the substrate.

There is a disadvantage when cavities are formed in the packaging substrate. Unless the chips are placed face down or unless the chips are all of the same thickness, planarity is difficult to achieve. Further, there will be a gap between the chips and the substrate which would have to be filled in with some type of polymer. When polymers are cured, shrinkage of the polymer would occur in the gap leaving a slight depression around the periphery of each chip. This can cause problems during formation of the interconnect wiring.

Even if the chips were placed face down in the cavities, thereby providing planarization of the active device surfaces, severe difficulties in alignment of the chips would result during the process steps to form chip-chip wiring. As noted previously, if the chips are placed in prefabricated cavities with the backsides down, the difference in thickness of the various chips would prevent planarization of the active device layers over which the interconnections are to be formed. These problems would arise regardless of the nature of the substrate, that is, whether the substrate is a ceramic, an anisotropically etched silicon layer, or a polymer. Further, the cost and complexity in fabricating such a structure presents a problem.

Accordingly, it is an object of the present invention to provide a multi-chip module and method for making the same which can be easily formed to provide a structure in which the active device faces of the chips are coplanar and in which cooling can be easily achieved.

It is another object of this invention to provide a multi-chip package and method for making the same which will allow high density interconnections between chips without the need for a substrate having preformed cavities therein.

It is another object of this invention to provide a structure and method for high density interconnection of integrated circuit chips, where the interconnect wiring does not impede heat flow from the chips to the substrate.

It is another object of this invention to produce a high density interconnect multi-chip module which is inexpensive and easy to produce.

BRIEF SUMMARY OF THE INVENTION

In a preferred embodiment, integrated circuit chips are placed in close proximity to one another on a planar substrate which preferably has an adhesive layer thereon. The chips are mounted face-down, i.e., with their active device surfaces in contact with the adhesive layer. This ensures that all chips have coplanar active device surfaces. In order to improve adhesion of the chips to the substrate and ensure device isolation, the backside of the chips can be coated with an insulator or dielectric. A conformal material is preferred. As a further option, a metallic shield or ground plane can be deposited over the conformal coating.

The structure is then turned over in order to fabricate the interconnection wirings. Openings are made through the substrate and the adhesive layer to form access to the chip I/O's. Metallurgical contact is then made to the chip. Subsequent conducting and insulating layers are formed using standard lithographic techniques in order to provide multiple levels of metallization, as needed. Edge pins electrically connected to any wiring level can also be cast in this structure for electrical connection to another packaging level.

The substrate is preferably a flex material, such as a polyimide, having a thin adhesive layer thereon. As an alternative, the substrate can be a nonflexible material, such as a glass, that is later removed after a sufficiently rigid structure of integrated circuit chips is obtained.

In this technique, the final array of chip is very dense and the active device faces of all chips are in the same plane, facilitating interconnections between the chips. The cooling structure, such as heat sinks and fins or fluid chambers, can be located on the backside of any chip, away from the various interconnection layers.

The various objects, features, and advantages of the invention will be apparent from the following more particular description of the preferred embodiments.

BRIEF DESCRIPTION OF THE DRAWINGS

FIGS. 1A–1I illustrate the various process steps for providing a multi-chip module in accordance with the present invention.

DESCRIPTION OF A PREFERRED EMBODIMENT

Figure 1F:
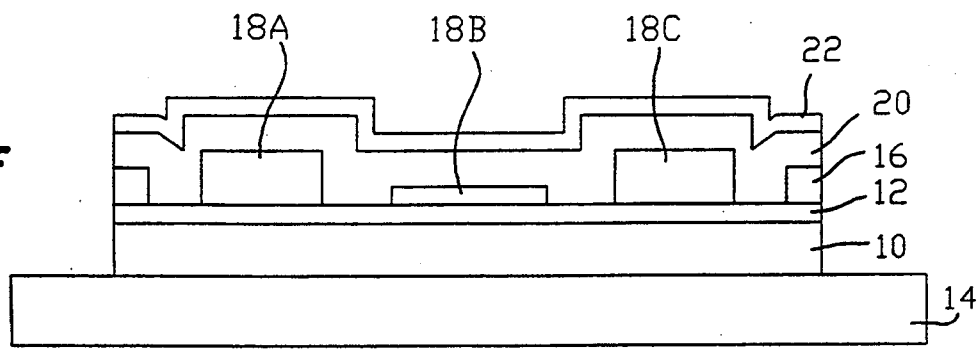

A multi-chip module capable of high density interconnects can be easily and inexpensively fabricated using the technique shown in FIGS. 1A–1I. In this approach, coplanarization of the active device surfaces of the chips is easily obtained and the chip interconnection metallization is not formed between the chip and the substrate. Further, there is no difficulty in providing alignment of the chips to the chip wiring interconnections and a substrate having preformed cavities therein is not required. This approach will accommodate chips having any desired thickness and is therefore suitable when packaging into a multi-chip module chips providing various circuit functions, such as memory, logic, voltage regulation, power supplies, etc. The need for more expensive substrates, such as multilayer ceramics and anisotropically etched silicon, is also unnecessary.

FIG. 1A illustrates a suitable substrate, which in this embodiment is comprised of a polymer layer 10 having an adhesive layer 12 thereon. The polymer can be a flexible material such as a polyimide, while the adhesive layer can be chosen from a number of suitable materials including Pyralux (a trademark of E. I. DuPont).

In FIG. 1B, the substrate is placed on a glass plate 14 where polymer layer 10 is in contact with the glass layer 14. If needed, polymer layer 10 can be taped to glass 14 in order to keep it taut, flat and free of wrinkles.

As an optional step, a support frame 16, such as a stainless steel frame, can be placed over the adhesive layer 12 in order to keep the substrate flat and free of stress, as shown in FIG. 1C. The frame 16 is cemented to the substrate via the exiting adhesive layer 12 or another type of adhesive (such as epoxy) can be used for this purpose. A suitable support frame is, for example, one which has an annular square shape having external dimensions of about 7 inches×7 inches and having an opening therein of about 6 inches×6 inches. The frame thickness can be about 0.030 inches, where the frame is fabricated by known techniques such as electrodischarge machining. The exact shape of the frame is arbitrary, as its main use is to provide structural rigidity during the initial process steps, especially when the substrate is a flex material. The frame can be later removed, or left as part of the final package.

FIG. 1D illustrates a plurality of chips 18A, 18B, and 18C that have been placed in contact with adhesive layer 12. Chips 18A–18C are placed circuit-side down onto the adhesive layer. This is easily accomplished with a high degree of accuracy by using a "pick and place" tool that uses a system capable of visual recognition. The system can also utilize a prism to align a chip, such as a flip-chip, to a pattern such as a glass photo mask.

The system then transposes the chip onto the substrate. Subsequent chips or devices are placed on the substrate in a similar manner, retaining the relation and accuracy of the mask. Bonding of the various chips can be done as the chips are placed in their respective locations utilizing a thermode or another heating method. As an alternative, the bonding step can occur after all of the chips are placed on adhesive layer 12. If this is done, bonding can easily be achieved by placing the structure comprising the chips 18, substrate, and glass layer 14 in an oven or hot press. Use of a glass photo mask in this manner allows the use of the same mask system for subsequent accurate wiring to corresponding interconnections. Further, it allows the chips to be easily placed in close proximity to one another on the same plane.

FIG. 1E shows the resulting structure after the backsides of the chips 18A–18C are coated with an insulator or dielectric 20. This coating is used to improve the adhesion of the chips to the substrate and to ensure chip isolation. It also helps to avoid stray electrical or static damage, It is desirable that coating 20 have conformal properties to enable it to flow into the spaces between the chips 18 for providing a relatively planar surface. A preferred dielectric 20 is a material such as Parylene (a trademark of Nova Tran). Parylene is an organic dielectric which can be vapor deposited with excellent properties. It is totally conformal and will follow the absolute device contours on which it is deposited. This feature is particularly important in those situations where the chips do not have perfectly straight edges of where the edges are not perfectly vertical Such nonperfect edges can occur during the normal dicing operation when the chips are cut from the initial silicon wafer.

A metallic shield or ground plane 22 can then be deposited on insulator layer 20 by any standard metallization process including sputtering, electroless or electrolytic plating, etc. Metallic shield 22 can be any well known conductor material including copper, Al, Mo, magnetic materials, etc. The use of a metallic shield or ground plane is generally of most significance in the design of high speed circuits in situations where impedances, capacitive coupling, etc. have to be considered. If desired, the coating 20 can be made of sufficient thickness that it can be etched to provide a planar surface over all of the chips.

Figure 1G:
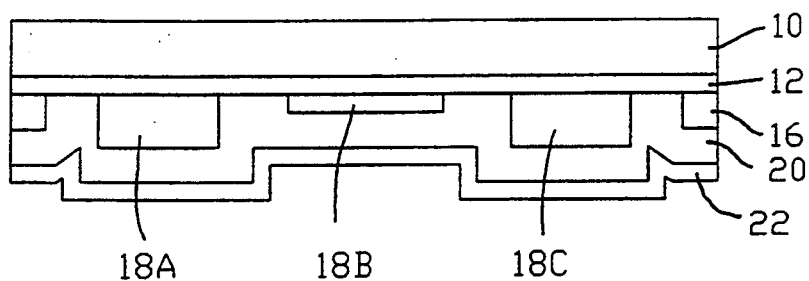
Figure 1H:
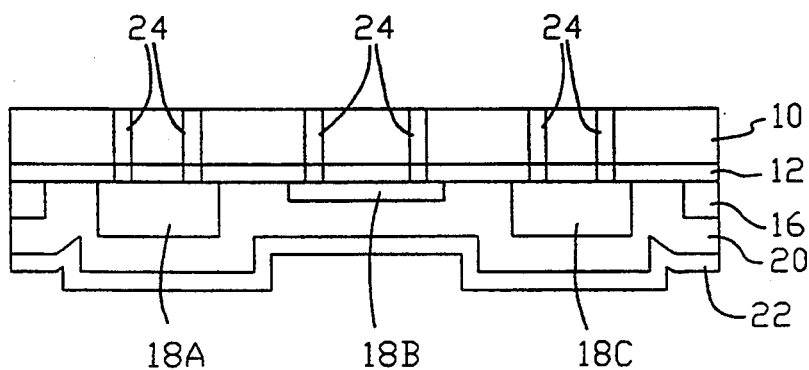

The frame 16 is now turned over and glass layer 14 is removed in order to fabricate the interconnection wiring plane (s). This is illustrated in FIG. 1G. The polymer layer 10 is now the first insulating layer and access vias have to be made through it and the adhesive layer 12 to allow access to the underlying chip circuits. Openings 24 through polymer layer 10 and adhesive layer 12 can be made in various ways including excimer laser ablation utilizing point-by-point ablation or ablation through an appropriate mask. As alternative, chemical etching or reactive ion etching can be used to provide openings 24, which are indicated in FIG. 1H. Frame 16 can be removed or left as part of the structure in order to provide increased structural strength.

Figure 1I:
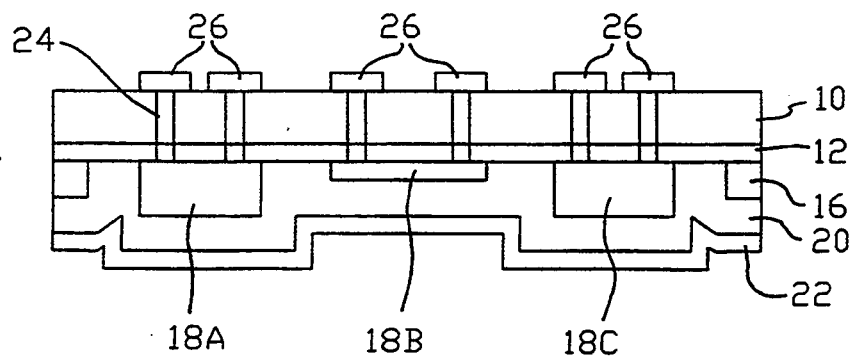

Once access to the chip I/O's is accomplished, a conductive seed layer is deposited in the openings to make electrical contact to the chip. This is followed by application of the proper resist, metal interconnection imaging and metal plating. Once the interconnection metallization is in place, the resist layer is removed and the remaining seed layer is etched away. As an alternative other types of metallization techniques can be used. FIG. 1I illustrates the formation of the interconnection metallization 26 over the plated via holes 24.

Subsequent metallization and insulating layers, as well as interconnecting vias, can be formed over the conductor layer 26. An example is the deposition of an insulator, such as an insulating polyimide, over the conductor layer 26, followed by the formation of vias in this insulating layer. Subsequent metallization would be applied in the vias and across the surface of this insulator layer to provide another metallization level. The insulator or dielectric can be deposited by, for example, spinning, spraying or lamination to the conductor layer 26. Multi-level metallization and the appropriate ground planes can be formed in this manner to achieve the final electrical layout. Exit from the multi-chip module to the outside world can be accomplished using standard edge connectors, bumping or wire bonding. Suitable edge connectors such as cast pins are shown in FIG. 2F. The size of the frame 16 is made to suit the design and layout that is desired.

The final structure can be kept as a flex circuit or the backside can be potted in an appropriate matrix that could include fillers to enhance heat dissipation. Further, the backside can be molded with fins or other heat dissipating structures such as heat pipes. In this preferred embodiment, the substrate 10 on which the chips are supported is also the first level of insulation on the active device surfaces and ensures that these surfaces lie in a common plane.

FIGS. 2A–2F show an alternative embodiment which can be used if there is a problem in procuring prefabricated substrate film 10 in the required thickness or composition to met the necessary electrical properties. In this embodiment, the selected substrate and adhesive layer can be cast on a glass plate or other suitable surface that is previously prepared with a sacrificial layer in order to separate the film from the substrate glass once the frame is bonded to it. After this, the various steps are continued as described with respect to FIGS. 1A–1I.

Figure 2A:
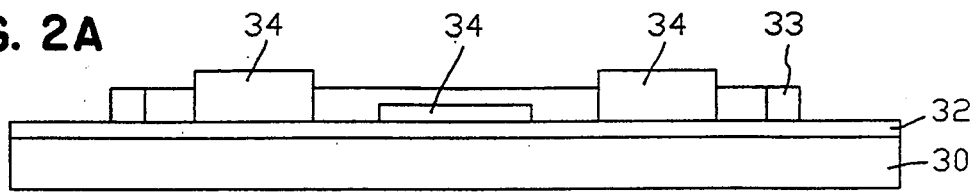
FIGS. 2A–2F illustrate process steps for forming the desired structure, using an alternative approach.

In FIG. 2A, a glass layer 30 has an adhesive layer 32 thereon. An optional frame 33 is bonded to glass layer 30 by adhesive layer 32. The frame functions the same as frame 16 in the previous embodiment. Adhesive layer 32 can be of the same composition as the adhesive layer 12. A plurality of integrated circuit chips 34 are then placed on adhesive layer 32, using the techniques described previously. Chips 34 are mounted with their active device faces in contact with adhesive layer 32.

Figure 2B:
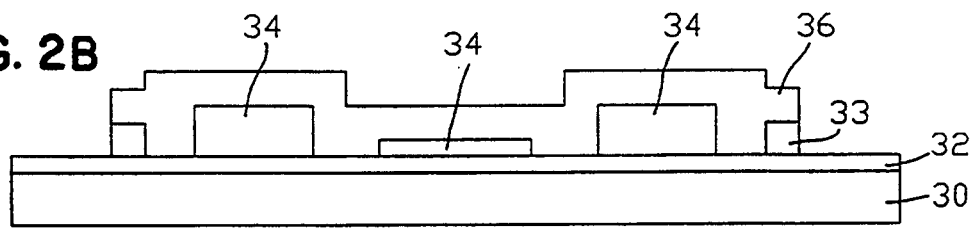

In FIG. 2B, chips 34 are coated with a conformal insulating layer 36. A suitable insulator is Parylene (TM).

Figure 2C:
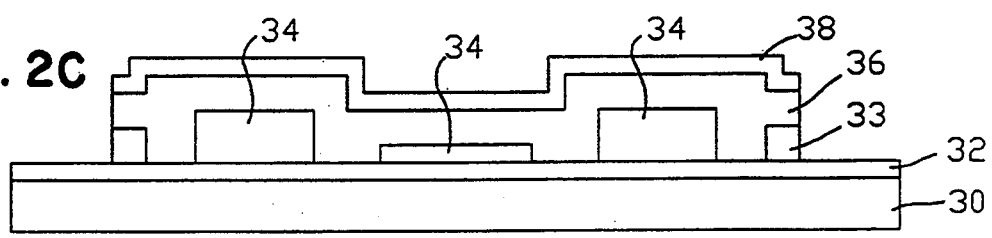

In FIG. 2C, a ground plane 38 is optionally formed over the conformal coating 36. As an option, the entire structure can be potted in a material such as an epoxy having silicon powder in it. The presence of the silicon powder is helpful in heat dissipation and in matching the thermal expansion coefficient of the potting material to that of the silicon chips 34.

Figure 2D:
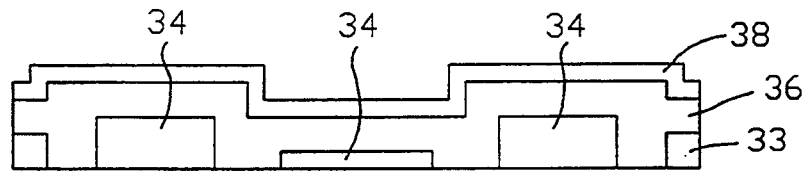

In FIG. 2D, glass plate 30 is removed. This can be done by dissolving the adhesive interface between the glass and the chips, or by laser ablation. As an alternative, a release layer (not shown) can be used between the glass 30 and the adhesive layer 32.

Figure 2E:
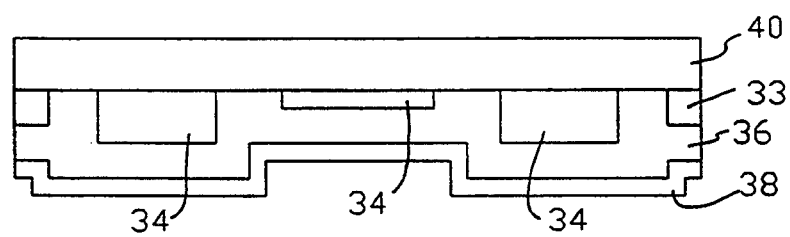
Figure 2F:
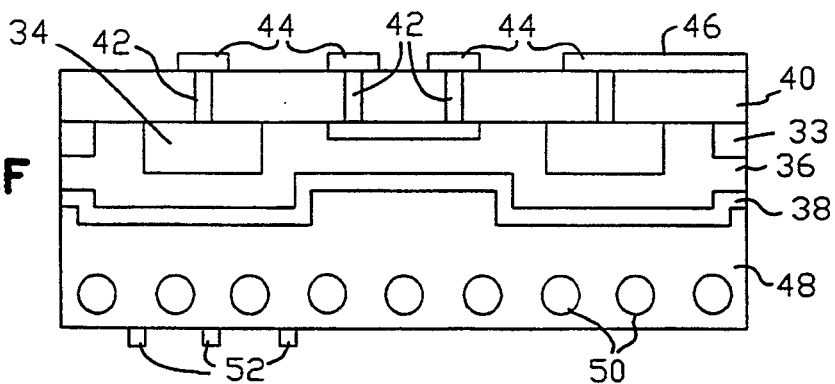

The frame 33 is then turned over in preparation for the formation of the chip interconnect metallurgy. At this stage of the process, the active device surfaces of the chips 34 are not in contact with an insulating substrate material. Therefore, an insulator layer 40 is deposited over the active device surfaces 34, as shown in FIG. 2E. Insulator layer 40 can be a polymer, oxide layer, etc. Polyimide is a suitable material.

In order to have access to the chip I/O's, via openings 42 are formed in insulator 40, followed by metallization in the vias and the deposition of the interconnect metallurgy 44 and edge connector pins 46. Formation of the vias and subsequent deposition of the conductive material used to contact the chip I/O's and to provide the chip-to-chip interconnections are done as was described with respect to the embodiment of FIGS. 1A–1I.

Additional layers of insulation and metal can then be formed over metallization layer 44 in order to provide the desired final electrical layout.

In these structures, cooling is easily provided to the backsides of the various chips without there being interconnection metallurgy between the chip and the cooling structure. FIG. 2F illustrates a cast epoxy layer 48 having silicon particles therein. Heat pipes 50 are cast into layer 48, as are cooling fins 52. The heat pipes 50 are used for fluid heat extraction and can be made of plastics or metal. The "lost wax" process is a suitable technique for casting the heat pipes in layer 48.

The active device faces of all chips are in the same plane and the gaps between chips are completely filled with the conformal coating material. This provides advantages when forming the interconnection metallurgy, as it is not necessary to have the metallurgy be formed above gaps or into very irregular topography between the various chips.

While the invention has been described with respect to particular embodiments thereof, it will be understood by those of skill in the art that various can be made therein without departing from the spirit and scope of the present invention. These variations include many other well known techniques for depositing insulating and conductive layers, where the insulators are polymers, oxides, nitrides etc. and the conductive layers are single element metals, alloys, highly doped semiconductors, conductive polymers, etc. A further variation is that the adhesive layer 12 may be eliminated if the chips can be directly bonded to the substrate 10. The invention is intended to be limited only by the claims issuing thereon.

I claim:

1. A method for forming a multi-chip module with high density interconnections, including the sequential steps of:

providing an insulating substrate having a planar surface, contacting said insulating substrate with a plurality of integrated circuit chips placed closely adjacent but separate from one another and with their active device surfaces abutting said insulating substrate, said active device surfaces being substantially coplanar with one another, bonding said chips to said substrate, coating the backsides of said chips and the gaps therebetween with a conformal dielectric coating material to produce a mechanically rigid structure in which said dielectric coating material contacts said insulating substrate, forming openings in said substrate, said openings extending to said coplanar active device surfaces of said chips, and forming metallization in said openings and over said substrate to provide chip-to-chip electrical interconnection.

2. The method of claim 1, including the further step of depositing alternating layers of insulating and conductor layers on said electrical interconnection.

3. The method of claim 1, including the further step of depositing a metallic layer on said conformal dielectric coating material located on the backsides of said chips.

4. The method of claim 1, where said insulating substrate is a flexible material.

5. The method of claim 4, where said insulating substrate is a polymer.

6. The method of claim 1, including the step of forming a conductive layer on said conformal layer.

7. The method of claim 1, including the further step of providing a cooling structure adjacent the backsides of at least some of said integrated circuit chips.

8. The method of claim 1, including the further step of placing a frame on said insulating substrate prior to the placement of said chips thereon, said frame surrounding said chips and being bonded to said substrate.

9. A method for forming a multi-chip module having high density interconnects including the sequential steps of:

providing a sacrificial substrate having a planar surface, contacting said substrate with a plurality of integrated circuit chips placed closely adjacent but separated from one another and with their active device surfaces abutting said substrate, said active device surfaces being substantially coplanar with one another, bonding said circuit chips to said substrate, coating the backsides of each said chip and the gaps therebetween with a conformal dielectric coating material to produce a mechanically rigid structure, said dielectric coating material being in contact with said substrate, removing said substrate, forming an insulating layer on the active device surfaces of said integrated circuit chips and over said dielectric coating material located in the gaps between said chips, forming openings in said insulating layer extending through said insulating layer to the coplanar active device surfaces of said integrated circuit chips, and forming metallization in said openings and over said insulating layer to provide electrical interconnection between said chips.

10. The method of claim 9, including the further step of depositing an insulating layer and a conductive layer over said electrical interconnection.

11. The method of claim 9, where said substrate is a glass.

12. The method of claim 9, including the further step of forming a conductive layer over said conformal layer.

13. The method of claim 9, including the further step of providing a cooling structure adjacent to the backsides of at least some of said integrated circuit chips.

14. The method of claim 9, including the further step of placing a frame in contact with said substrate prior to placement of said chips thereon, said frame having a sufficiently large opening therein into which said chips are placed in contact with said substrate.

15. A method for forming a multi-chip module with high density interconnects, including the sequential steps of:

placing an insulating flexible substrate on a rigid member having a planar surface, placing a frame on said flexible substrate to keep it in contact with the planar surface of said rigid member, contacting said substrate with a plurality of integrated circuit chips placed closely adjacent but separate from one another and with their active device surfaces in contact with sad substrate, said active device surfaces being substantially coplanar with one another, bonding said chips to said substrate, coating the backsides of each of said chips and the gaps therebetween with a conformal dielectric coating material to produce a mechanically rigid structure in which said coating material contacts said substrate, forming openings in said substrate extending to said active device surfaces of said chips, forming metallization in said openings extending from the surface of said substrate to the coplanar active device surfaces of said chips, and depositing a conductive layer over said substrate and into contact with the metallization in said openings in order to provide electrical interconnections between said chips.

16. The method of claim 15, including the further step of boding said frame to said substrate.

17. The method of claim 16, where said rigid member is removed prior to forming said openings through said substrate.

18. The method of claim 17, where said substrate is a polymer.

19. The method of claim 18, including the further step of providing an electrically conductive layer over said conformal dielectric coating material.

20. The method of claim 18, including the further step of providing a cooling structure adjacent the backsides of at least some of said integrated circuit chips.

21. A multi-chip module comprising:

a flexible insulating substrate having a planar surface, a plurality of semiconductor integrated circuit chips each of which has an active device surface, said chips being bonded to said insulating substrate closely adjacent but separate from one another with their active device surfaces in contact with said planar surface, the active device surfaces of said chips being substantially in the same plane, a conformal dielectric layer located over the backsides of said chips and in the gaps between said chips, said conformal dielectric layer contacting said insulating substrate in said gaps and securing said circuit chips to said flexible substrate, a plurality of electrically conductive vias in said substrate extending through said substrate to the coplanar active device surfaces of said chips, and a layer of chip interconnection metallurgy in electrical contact with said vias and extending over the surface of said substrate.

22. The multi-chip module of claim 21, further including a conductive layer in contact with said conformal dielectric layer.

23. The multi-chip module of claim 21, further including a cooling structure adjacent to said conformal layer.

24. The multi-chip module of claim 21, where said substrate is an insulating polymer.

25. The multi-chip module of claim 24, further including a frame surrounding said chips, said frame being bonded to said substrate.

* * * * *